United States Patent [19]

Dholakia

[11] Patent Number: 4,910,166
[45] Date of Patent: Mar. 20, 1990

[54] METHOD FOR PARTIALLY COATING LASER DIODE FACETS

[75] Inventor: Anil R. Dholakia, Plainsboro, N.J.

[73] Assignee: General Electric Company, Schenectady, N.Y.

[21] Appl. No.: 297,520

[22] Filed: Jan. 17, 1989

[51] Int. Cl.[4] .................. H01L 21/20; H01L 21/302
[52] U.S. Cl. .......................... 437/129; 148/DIG. 95; 148/DIG. 143; 372/49; 357/17; 437/80; 437/51; 437/226; 437/905; 437/948
[58] Field of Search .............. 148/DIG. 95, 102, 104, 148/106, 143; 357/17, 16; 372/43, 48, 49; 437/23, 80, 51, 127, 226, 227, 904–906, 948

[56] References Cited

U.S. PATENT DOCUMENTS

| 3,235,428 | 2/1966 | Naymik | 437/226 |
| 3,422,527 | 1/1969 | Gault | 437/226 |
| 3,579,055 | 5/1971 | Ross | 437/226 |
| 3,591,921 | 7/1971 | Cosper | 437/226 |
| 3,622,906 | 11/1971 | Nyul | 437/226 |
| 3,866,238 | 2/1975 | Monroe | 372/49 |
| 4,100,508 | 7/1978 | Wittke | 372/49 |
| 4,197,631 | 4/1980 | Meyer et al. | 437/226 |
| 4,734,380 | 3/1988 | Tsang | 437/226 |
| 4,751,708 | 6/1988 | Jackson et al. | 372/49 |
| 4,788,161 | 11/1988 | Goto et al. | 437/226 |

FOREIGN PATENT DOCUMENTS

| 0211292 | 11/1984 | Japan | 372/49 |
| 0232475 | 12/1984 | Japan | 437/129 |
| 0003182 | 1/1985 | Japan | 437/129 |
| 0198884 | 10/1985 | Japan | 372/49 |

Primary Examiner—Brian E. Hearn
Assistant Examiner—William Bunch
Attorney, Agent, or Firm—William Squire; James C. Davis, Jr.; Webb, II: Paul R.

[57] ABSTRACT

Bars of integral laser diode devices cleaved from a wafer are placed with their p regions abutting and n regions abutting. A thin BeCu mask having alternate openings and strips of the same width as the end facets is used to mask the n region interfaces so that multiple bars can be partially coated over their exposed p regions with a reflective or partial reflective coating. The partial coating permits identification of the emitting facet from the fully coated back facet during a later device mounting procedure.

7 Claims, 2 Drawing Sheets

METHOD FOR PARTIALLY COATING LASER DIODE FACETS

The invention described herein was made in the performance of work under NASA Contract No. NAS 1-17441 and is subject to the provisions of Section 305 of the National Aeronautics and Space Act of 1958 (72 Stat. 435; 42 U.S.C. 2457).

This invention relates to a method for applying a reflective coating to a laser diode facet.

The two facets which form the two mirrors of a lasing cavity in a laser diode device are coated with evaporated layers of $Al_2O_3$ and silicon. Generally, the emitting facet has a singe layer of $Al_2O_3$ of a thickness between 800 and 2400 angstroms. The other back facet generally has alternate layers of 1200 angstrom of $Al_2O_3$ and 600 angstroms of silicon for a total of six layers. When mounting a diode, it is necessary to distinguish the emitting facet from the back facet to orient the diode. Generally the two coatings are of different colors but sometimes these colors are not easily identifiable and, especially for a color blind person, it is virtually impossible to distinguish the two coatings.

Normally, in identifying the coatings, the coatings are examined under a microscope and the front facet detected and so noted one diode at a time. When both the front and back facets are fully coated with the evaporated reflecting layers, one of which is partially reflecting for forming the emitting facet, it is often generally difficult to readily visually identify the partially transmitting facet from the fully reflecting facet because at times the color differential between the two materials used for the emitting and reflecting facets may be somewhat slight and relatively difficult to distinguish.

It is known to produce certain of these diodes with one of the facets, normally the emitting facet, partially coated with the reflecting layer while the other facet is fully coated. This procedure makes it somewhat easier to identify the facets when mounting the diode on its support. The partial coating is made by masking half the facet's area, normally that half of the facet adjacent to a side of the diode of one conductivity, to provide a shadow for the evaporated material.

The masking fixture processes one bar of diodes at a time making it relatively time consuming and difficult to partially coat all bars in production. A bar 200 of diodes, FIG. 2, is formed by cleaving a section from a larger wafer 10 (FIG. 1) comprising a number of contiguous diodes 22 in a common substrate. A plurality of striped contacts 14, 14', respectively in the wafer and bar, form the optical path in the diodes. The stripes are parallel terminating at the two opposing facets 204 and 206 of each corresponding diode. One of the facets is formed as the rear facet and is fully coated. A bar is coated on a side comprising one set of diode facets in a single evaporation run by placing the bar on its edge, one bar at a time. The problem with this technique as recognized by the present invention, is that only a single bar can be coated at one time.

Normally the active region of these diode lasers are relatively close to a surface of the device, for example, within 1 or $2\mu$, the thickness of the device being about 4 mils. Usually these devices are 8 by 12 mils with the optical path extending along the 12 mils length. To partially coat one facet requires coating at least the active region and the region adjacent to the active region to the contact. Because of the relatively small dimensions involved, it is relatively difficult and time consuming using prior art systems to partially coat the end faces of a bar. The reason for this difficulty is that a separate mask is required for each bar, each separate mask being of relatively small width dimension e.g., one or two mils. Such masks are difficult to manipulate. As a result, present practice generally coats both sides fully with the partial coating falling into disuse due to the difficulties involved. The present inventor recognizes a need for a method to simultaneously partially coat the end facets of such laser diodes in a plurality of bars to make the coating procedure less costly.

In accordance with the present invention, a step for forming one of the coating includes positioning a plurality of the bars in abutting relation and partially masking the corresponding end facets of all of the bars excluding the active regions thereof. A coating is then applied to the marked bars to thereby simultaneously coat the exposed regions of the partially masked bars.

As a result, a single mask for multiple bars is easier to manufacture and manipulate since the abutting regions which are masked are double the masked area of a single bar and therefore more practical to deal with.

A feature of the invention includes placing the bars such that portions of the same conductivity type are abutting, then masking the interface of the bars furthest from the active region and leaving exposed the alternate interfaces of abutting bars including the active regions. In this way, exposing the masked bas to a common evaporating coating simultaneously partially coats the end facets of all of the bars.

Figure 1:
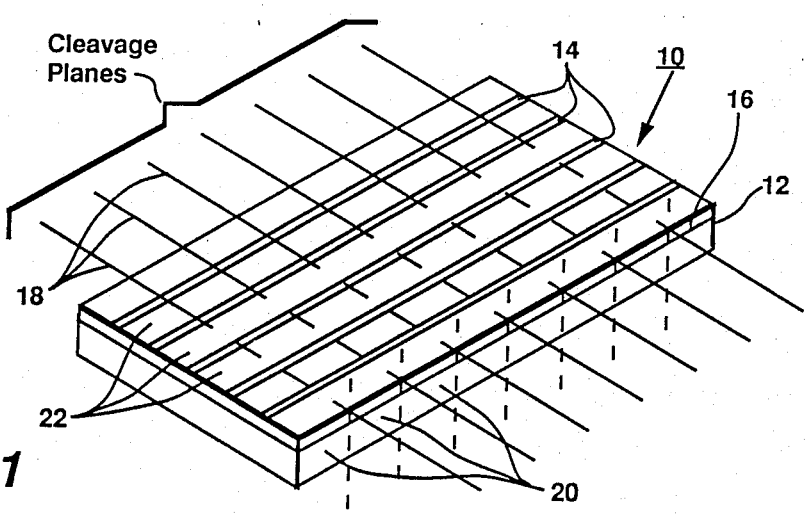
FIG. 1 is an isometric view of a wafer of laser diode devices during a fabrication step prior to the devices being separated from the wafer.

In FIG. 1, wafer 10 comprises a substrate 12 from which a plurality of laser diode devices are formed. The construction of representative laser diode devices are illustrated in patent Re 29,866 and in an article entitled "GaAs/GaAlAs Diode Lasers with Angled Pumping Stripes" by Scifres et al. in the IEEE Journal of Quantum Electronics, Vol. QE-14, No. 4, April 1978, pp. 223-227. The layers and materials forming such diode laser devices are well known and further details thereof need not be described herein. The substrate 12 includes a plurality of parallel stripes 14 which form the optical beam path in each of the subsequently formed laser devices. Substrate 12 also includes an active layer 16. The construction of the stripes 14 and active layer 16 are disclosed by way of example in the aforementioned patent Re. 29,866 and the Scifres et al. article. The so-formed wafer 10 is then cleaved along cleavage planes 18 to form bars 20 of devices 22, a typical bar being shown in FIG. 2.

Figure 2:
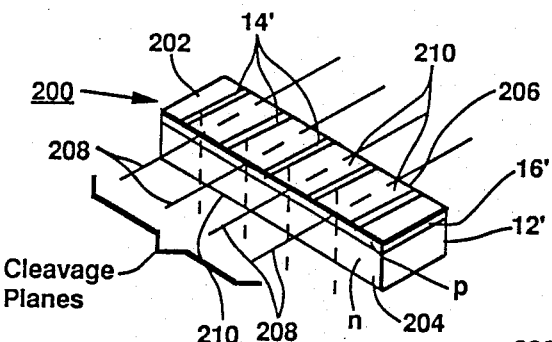
FIG. 2 is a representative bar of devices formed by cleaving the wafer of FIG. 1 along certain cleavage planes.

In FIG. 2, representative bar 200 comprises a substrate 12' formed from substrate 12 and having an active layer 16' formed from layer 16. Spaced along one surface 202 of bar 200 are parallel stripes 14'. An end face 204 of bar 200 forms one facet of each of the laser diodes. End face 206 forms a second facet of each of the devices. The bar is cleaved along cleavage planes 208 to form separate laser devices 210.

Figure 3:
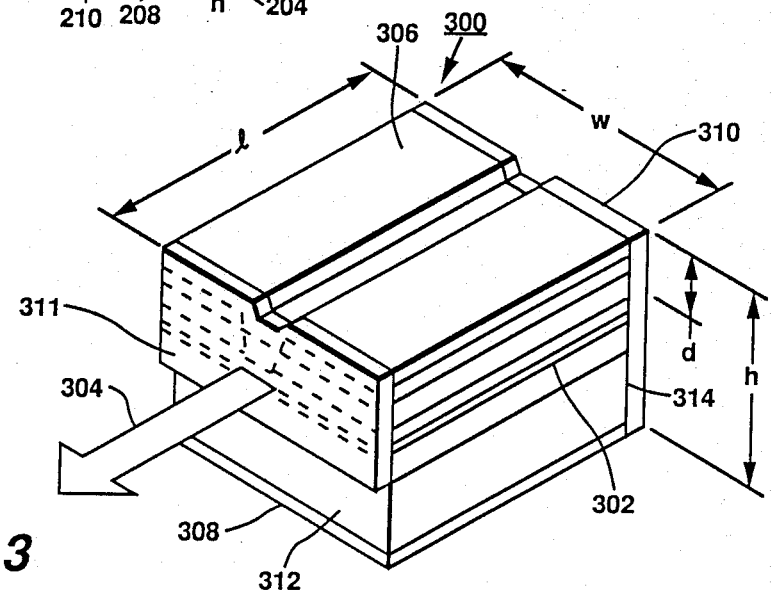
FIG. 3 is an isometric view of a coated device formed from the bar of the embodiment of FIG. 2 and coated according to the method of the present invention.

In FIG. 3, a typical double heterostructure striped geometry semiconductor laser diode device 300 has a width w of about 8 mils, a length 1 of about 12 mils and a thickness t of about 4 mils. Active layer 302 emits a beam 304 when a current is applied to the contacts 306 and 308. In a device such as device 300, the active layer 302 is spaced a distance d within 1 or $2\mu$ from the contact 306. The region between the active layer 302 and contact 306 is one conductivity type, usually p, and the region between the active layer 302 and the contact 308 is the opposite conductivity type, for example, n.

Figure 4A:
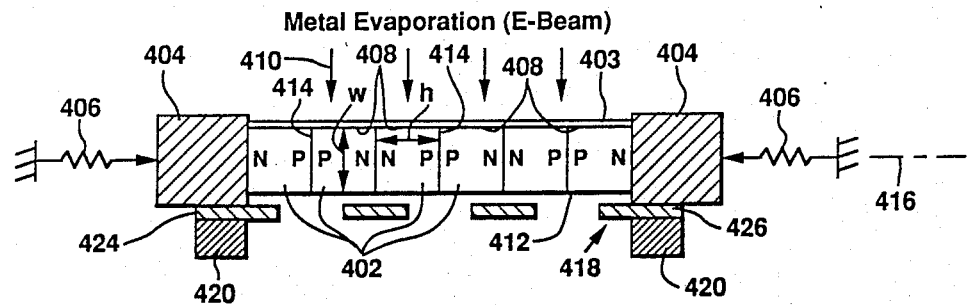
FIGS. 4a and 4b are end views of a fixturing apparatus for depositing a reflective coating on a plurality of bars of the type illustrated in FIG. 2 in accordance with the present invention.

In FIG. 4a, to provide a full coating 403 on one end facet of a laser diode device, a plurality of bars 402 are clamped together by two clamping members 404 held together by applying an inward pressure against the members via springs 406 or other clamp devices. The springs 406 force the members 404 together squeezing the bars 402 in abutting relation. The bars are assembled with like conductivity regions abutting in pairs as shown. A mask 418 is clamped to members 404 by clamps 420. The mask 418 is juxtaposed over the facets 412 on the side of the bars opposite facets 408.

The facets 408 of the bars are completely coated with coating 403 by exposure to an evaporated reflective coating media 410 in an evacuated chamber. The mask 418 is of no effect at this time. The assembly is rotatable about axis 416 to expose facets 412 and mask 418 to coating media 422, FIG. 4b, after coating 403 is applied.

The mask 418 ends 424 and 426 rest on members 404. The clamps 420 are placed over the ends 424 and 426. A clamping mechanism, not shown, secures mask 418 between the clamps 420 and clamp members 404. The mask 418 is spaced slightly, e.g., 1 to 2 mils, from the facet being coated to provide a shadowing effect but may also abut the facets in other implementations. The opposite end facets 412 are then exposed to media 422 and coated through mask 418, FIG. 4b. This provides a partial mirror coating over the active region (not shown in FIGS. 4a and 4b) and the p conductivity type region between that active region and the next adjacent contacts 414. The coating covers both the relative narrow p and active regions and part of the n region. The reason for coating the p region and the n region is that the p region being only several microns thick, would not provide sufficient coating width to visually distinguish between the partially coated side and the fully coated side.

Figure 5:
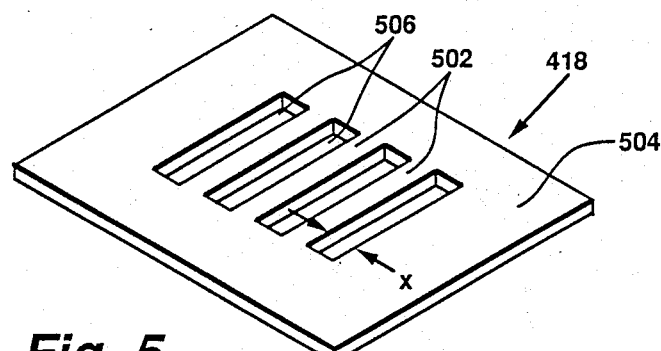
FIG. 5 is an isometric view of a mask employed in accordance with one embodiment of the present invention.

Mask 418, in accordance with one embodiment of the present invention, is illustrate in FIG. 5 for masking multiple bars simultaneously with a partial reflective coating on facets 412. Mask 418 comprises a photo-etched pattern of typically 4 mils wide rectangular strips 502 in a representative 2 mils thick beryllium copper sheet 504. The width x of the strips is the same as the thickness t of the bars to be coated, for example, 4 mils. The strips 502 are spaced by representative 4 mils wide rectangular openings 506.

Figure 4B:
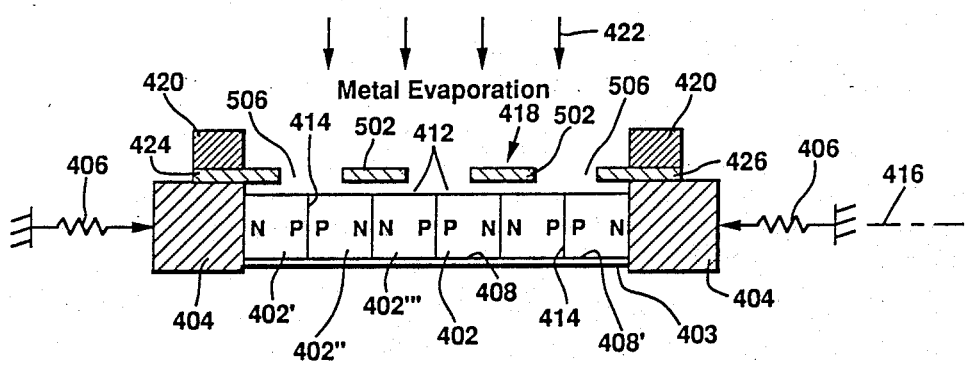

In FIG. 4b, the mask 418 is used as follows. A plurality of bars 402 are assembled with the p regions facing and contiguous with one another and with the n regions facing and contiguous with one another to form alternate p and n region interfaces. Successive interfaces thus are of different conductivity. For example, bar 402' has its p region facing the p region of bar 402" and the n regions of bars 402" and 402"' face one another.

The mask 418 is positioned with the strips 502 centrally over and juxtaposed with the n type conductivity interfaces of the abutting bars. Because the bars are 4 mils thick and the spacing of the openings 506 and strips 502 are also 4 mils, an equal region of the bars is exposed and covered in alternate fashion.

With the mask 418 so configured, approximately 50% of the end facets of each of the bars facing the masks are covered by the bars and 50% of the areas are exposed. Since each active region is located relatively close to its p region contact, this insures that the active region is coated. Thus, the p regions and the interfaces therebetween are exposed between the mask strips 402 and coated by the evaporated media 422. The media 422 may be used to coat either the fully reflective coating or the partially reflective coating and the other media 410 coating the other. What is important is that the active region is fully coated on both facets to form the mirror coating over the cavity region of the active layer.

The clamp members 404 are 9 mils in height as compared to the 8 mils of the bars w dimension so that the diode contact regions adjacent the facets of the bar stacks to be coated are completely covered by the clamp members 404 to insure no coating media is deposited on the contact regions.

In the embodiment of FIGS. 4a and 4b, it is assumed that the stripes (not shown) corresponding to stripes 14', FIG. 2, are on the p regions of the laser diode devices. If the stripes were on the n region, then the positions of the p and n regions relative to the mask would be reversed. While 50% of the partially coated end facets are coated, more or less of the facets may be coated in accordance with a given implementation. The only significance is that the active region should be fully coated whether the coating material is partially reflective or fully reflective.

The fully reflective material which is approximately 90% reflective, comprises six layers of 1200 angstrom aluminum oxide and 600 angstrom of silicon for a total of six layers as described in the introductory portion. The emitting facet has a single layer of aluminum oxide of a thickness of between 800 and 2400 angstroms.

After the bars are so coated, they are then cleaved as illustrated in connection with FIG. 2 along cleave planes 208. The resulting devices appear as shown in FIG. 3 wherein the partially reflective coating 311 covers approximately 50% of the emitting facet 312 and coating 310 fully coats the rear facet 314 with a fully reflective coating.

What is claimed is:
1. A method of forming reflective coatings on a semiconductor laser device of the type comprising a body of semiconductor material having opposed coated end faces and an active layer between the end faces, said material having regions of first and second opposite conductivity types on opposite sides of said active layer, means adjacent to said active layer and one of said conductivity types for defining an optical path in the active layer and contact means coupled to the body at regions on opposite sides of said active layer for receiving an electrical current to generate light in said active layer along said path, one of said coatings being partially reflective for permitting said light to be emitted from the active region through that one coating, said method comprising:

forming a plurality of bars of said devices, each bar containing a plurality of devices;

forming a substantially reflective coating simultaneously on one end face of said plurality of said devices of each said bars; and forming said partially reflective coating simultaneously on the other opposed end faces of said plurality of devices of each said bars;

said latter forming step including positioning a plurality of said bars in abutting reaction, partially masking the corresponding end faces of all said bars excluding the active regions thereof and then applying a coating to said masked bars to thereby simultaneously coat the exposed regions of said partially masked bars.

2. The method of claim 1 wherein said contact means includes first and second contacts, said devices each comprise material of one conductivity type between the active layer and one of said contacts and material of a second conductivity type opposite the one conductivity type between the active layer and the other of said contacts, said latter forming step for coating a portion of the corresponding end faces includes the steps of:

(1) supporting said plurality of bars in said abutting relation;

(2) arranging the device surfaces at the contacts adjacent to the material of the same conductivity type in abutting facing relation wherein the next successive interfaces of abutting devices are of different conductivity types and alternate interfaces are of the same conductivity type;

(3) masking portions of each device excluding the active region thereof at those interfaces of the same conductivity so that only the device surfaces comprising alternate interfaces of one conductivity and the active region of each device are exposed; and (4) exposing said masked portions and exposed surfaces to one of said coatings to thereby coat only said exposed surfaces of all devices of said bars at the same conductivity region.

3. The method of Claim 2 wherein one conductivity is an n type and the other is a p type and wherein said exposed interfaces are primarily p type conductivity and the masked interfaces are primarily n type conductivity.

4. A method of forming reflective coatings on a semiconductor laser device of the type comprising a body of semiconductor material having opposed coated end faces and an active layer between the end faces, means adjacent to said active layer for defining an optical path in the active layer and contact means coupled to the body at regions on opposite sides of said active layer for receiving an electrical current to generate light in said active layer along said path, one of said coatings being partially reflective for permitting said light to be emitted from the active region through that one coating, said method comprising:

forming a matrix of said devices in a substrate, said matrix comprising a plurality of spaced parallel means for defining said optical path;

cleaving said substrate into a plurality of bars of devices, each bar having a first surface forming one of said end faces and a second surface forming the other of said end faces, each bar including a set of portions of said spaced parallel means for defining said optical paths;

supporting said bars on one of said end faces with the surfaces of the same conductivity facing in abutting relation, alternate interfaces of abutting bar pairs having the same conductivity;

masking the interfaces of the same conductivity while leaving exposed the active region and the interfaces of the opposite conductivity at the other of said end faces; and exposing said masked and exposed interfaces to one of said coatings to thereby coat only the exposed portions of said other end faces.

5. The method of claim 4 further including coating the one end faces over the entire surface of said one end faces.

6. The method of claim 4 wherein the areas of masked interfaces is about the same in size as the exposed interfaces.

7. A mask for use in the method according to claim 4 comprising a photoetched sheet of meal having a plurality of openings dimensioned to expose said active region at said interfaces of said opposite conductivity and intermediate strips for masking said interfaces of the same conductivity.

* * * * *